United States Patent [19]
Wakayama

[11] Patent Number: 5,936,472
[45] Date of Patent: Aug. 10, 1999

[54] OSCILLATING CIRCUIT WITH LIMITATION FUNCTION OF OSCILLATION FREQUENCY

[75] Inventor: Yasushi Wakayama, Tokyo, Japan

[73] Assignee: NEC Corporation, Tokyo, Japan

[21] Appl. No.: 09/034,759

[22] Filed: Mar. 4, 1998

[30] Foreign Application Priority Data

May 14, 1997 [JP] Japan .................................. 9-123949

[51] Int. Cl.⁶ .................................................. H03L 7/087
[52] U.S. Cl. ............................................. 331/11; 331/27
[58] Field of Search ................................. 331/11, 25, 27

[56] References Cited

U.S. PATENT DOCUMENTS

| | | | |
|---|---|---|---|
| 4,404,530 | 9/1983 | Stryer | 331/11 |
| 4,914,404 | 4/1990 | Ernst | 331/11 |

OTHER PUBLICATIONS

Messerschmitt (Sep. 1979) "Frequency Detectors for PLL Acquisition in Timing and Carrier Recovery", *IEEE Transactions on Communications COM–27* (9) :1288–1295.

*Primary Examiner*—Siegfried H. Grimm
*Attorney, Agent, or Firm*—Scully, Scott, Murphy & Presser

[57] ABSTRACT

In an oscillating circuit, an oscillator generates an oscillation signal with a frequency, increases the frequency of the oscillation signal in response to a frequency increase signal and decreases the frequency of the oscillation signal in response to a frequency decrease signal. A detecting unit receives the oscillation signal and a reference signal. The detecting unit outputs the frequency increase signal to the oscillator when a ratio of the frequency of the oscillation signal to a frequency of the reference signal is smaller than a first predetermined value, and outputs the frequency decrease signal to the oscillator when a ratio of the frequency of the oscillation signal to the frequency of the reference signal is larger than a second predetermined value.

18 Claims, 5 Drawing Sheets

OSCILLATING CIRCUIT WITH LIMITATION FUNCTION OF OSCILLATION FREQUENCY

BACKGROUND OF THE INVENTION

1. Field of the Invention

The present invention relates to an oscillating circuit, and more particularly to an oscillating circuit which includes a circuit for limiting a frequency range of an oscillation signal.

2. Description of the Related Art

A conventional oscillating circuit which includes a voltage controlled oscillator will be described with reference to FIG. 1.

In the conventional example of the oscillating circuit shown in FIG. 1, the change points of an input signal with respect to an oscillation signal from the voltage controlled oscillator are detected so that a frequency is adjusted based on the detected change points of the input signal. The conventional example of the oscillating circuit shown in FIG. 1 is a part of the circuit to extract a clock signal based on an input data signal to an input terminal 26 for performing retiming to the input data signal by a flip-flop circuit and so on. The clock signal having a frequency of twice of that of the input data signal is outputted from an output terminal 27. Generally, a circuit for adjusting a phase is added to this circuit to form a clock extraction circuit.

The circuit shown in FIG. 1 is composed of a frequency comparator 21, a constant current outputting circuit 22, a constant current inputting circuit 23, a capacitor 24 and a voltage controlled oscillator.

Here, the input terminal I1 of the frequency comparator 21 is connected to an input terminal 26, and the output terminal UP of the frequency comparator 21 is connected to the input terminal of the constant current outputting circuit 22. The output terminal DN of the frequency comparator 21 is connected to the input terminal of the constant current inputting circuit 23. The current output terminal of the constant current outputting circuit 22 and the current inputting terminal of the constant current inputting circuit 23 are connected to one of the terminals of the capacitor 24 and the input terminal of voltage controlled oxsillator 25. The other terminal of the capacitor 24 is connected to a negative power supply voltage. The output terminal 27 of the voltage controlled oscillator 25 is connected to the input terminal I2 of the frequency comparator 21.

The frequency comparator 21 outputs an increase signal from the output terminal UP, when the frequency of the signal inputted to the input terminal I1 is larger a half of the frequency of the oscillation signal inputted to the input terminal I2. Also, the frequency comparator 21 outputs a decrease signal from the output terminal DN when the frequency of the input signal to the input terminal I1 is smaller a half of the frequency of the oscillation signal to the input terminal I2. The constant current outputting circuit 22 outputs a constant current only for the time period while the increase signal is supplied from the frequency compactor 21. The constant current inputting circuit 23 inputs the constant current only for the time period when the decrease signal is supplied from the frequency compactor 21. The voltage controlled oscillator 25 changes the frequency of an oscillation signal based on the voltage supplied from the capacitor 24 to the input terminal.

In the oscillating circuit of FIG. 1, there is a case where the frequency of the input data signal to the input terminal 26 is smaller than a half of the frequency of the oscillation signal supplied from the output terminal 27. In the other words, there is a case where the frequency of the oscillation signal from the output terminal 27 is small to perform retiming of the input data signal to the input terminal 26 in accordance with the oscillation signal from the output terminal 27. In such a case, the capacitor 24 is charged. As a result, the input voltage to the voltage controlled oscillator 25 increases so that the oscillation frequency increases.

On the other hand, there is a case where the frequency of the input data signal to the input terminal 26 is larger than a half of the frequency of the oscillation signal from the output terminal 2. In the other words, there is a case where the frequency of the input data signal to the input terminal 26 is larger to perform the retiming of the input data signal to the input terminal 26 in accordance with the oscillation signal from the output terminal 27. In such a case, the capacitor 24 is discharged. As a result, the input voltage to the voltage controlled oscillator 25 decreases so that the oscillation frequency decreases.

Thus, the frequency of the input data signal to the input terminal 26 can be made to be a half of the frequency of the oscillation signal from the output terminal 27 through the above operation.

Next, the operation of the frequency comparator 21 of FIG. 1 is shown by FIGS. 2A to 2E.

As shown in FIG. 2A, each of time periods of the oscillation signal supplied to the input terminal I2 of the frequency comparator 21 is quartered. The quartered time intervals are called A, B, C, D in the order. In this state, the changing points of the input data signal supplied to the input terminal I1, i.e., the rising edge and falling edge are detected.

When the input data signal supplied to the input terminal I1 of the frequency comparator 21 has the waveform ② shown in FIG. 2B, so that the first changing point is in the time interval B and the second changing point is in the time interval C, the change from the time interval B into the time interval C is detected. As a result, it is determined that a half of the frequency of the oscillation signal supplied to the input terminal I2 is larger than the frequency of the input signal supplied to the input terminal I1, and the decrease signal is outputted from the output terminal DN.

On the other hand, when the input data signal to the input terminal I1 of the frequency comparator 21 has the waveform ③ shown in FIG. 2C, so that the first change point is in the time interval C and the second change point is in the time interval B, the change from the time interval C into the time interval B is detected. As a result, it is determined that a half of the frequency of the oscillation signal to the input terminal I2 is smaller than the frequency of the input signal to the input terminal I1, and the increase signal is outputted from the output terminal UP.

It should be noted that this circuit is described in "Frequency Detectors for PLL Acquisition in Timing and Carrier Recovery" (IEEE TRANSACTIONS ON COMMUNICATION, VOL. COM-27, NO. 9, SEPTEMBER 1979).

However, there is a problem in the conventional example of the oscillating circuit shown in FIG. 1 in that it erroneously operates when the difference in frequency between the input signals to the input terminals I1 and I2 is large, as the waveform ④ shown in FIG. 2D.

The reason will be described below. The waveform ④ shown in FIG. 2D is the waveform at the time when frequency of the input data signal to the input terminal I1 is very larger than the half of the frequency of the input signal to the input terminal I2. At this time, the change from the time interval B to the time interval C is detected. For this reason, the decrease signal is outputted from the output terminal DN nevertheless the frequency of the input data signal to the input terminal I1 is larger than that the half of the frequency of the input signal to the input terminal I2. As a result, the frequency of the input signal to the input terminal I2 is decreased.

On the other hand, the waveform ⑤ shown in FIG. 2E Is the waveform at the time when the frequency of the input data signal to the input terminal I1 is very smaller than the half of the frequency of the input signal to the input terminal I2. At this time, the change from the time interval C to the time interval B is detected. For this reason, the increase signal is outputted from the output terminal UP nevertheless the frequency of the input data signal to the input terminal I1 is smaller than that the half of the frequency of the input signal to the input terminal I2. As a result, the frequency of the input signal to the input terminal I2 is increased.

As described in "Frequency Detectors for PLL Acquisition in Timing and Carrier Recovery" (IEEE TRANSACTIONS ON COMMUNICATION, VOL. COM-27, NO. 9, SEPTEMBER 1979), the range where the frequency comparator 21 can be operated in the normal state is $$|\Delta\omega|<\pi f_1$$

$$\Delta\omega=2\pi f_1-2\pi f_2$$

where $f_1$ is a frequency of twice of the frequency of the input data signal to the input terminal I1, and $f_2$ is the frequency of the input signal to the input terminal I2. In other words, the frequency range is $$f_1/2<f_2<3/2\times f_1$$

The problem described above does not occur when the frequency range of the oscillation signal which is outputted from the voltage controlled oscillator 25 as the input signal to the input terminal I2 of the frequency comparator 21 is in the above frequency range. However, when the oscillating circuit is built in a semiconductor integrated circuit manufactured using a CMOS process and so on, the frequency range of the voltage controlled oscillator 25 greatly changes due to variance in the manufacturing process. The frequency range sometimes crosses the above-mentioned frequency range.

FIG. 3 is a diagram to describe the above manner. Referring to FIG. 3, a horizontal axis is input voltage to the voltage controlled oscillator 25 and the vertical axis is frequency of the output signal. It is supposed that a desired signal frequency, i.e. the frequency of the input signal supplied to the input terminal I1 is 12.5 MHz as shown in FIG. 3 by ①. In this case, the frequency of twice of the desired signal frequency is 25 MHz. When the variable frequency range is from 20 MHz (② of FIG. 3) to 30 MHz (③ of FIG. 3), the case is considered where the frequency changes twice due to the manufacturing condition. In this case, the minimum frequency of 20 MHz (② of FIG. 3) possibly changes to 10 MHz (④ of FIG. 3). The maximum frequency of 30 MHz (③ of FIG. 3) possibly changes to 60 MHz (⑤ of FIG. 3). ⑥ of FIG. 3 is the voltage vs. frequency characteristic when the oscillation frequency is large in the manufacturing condition. Also, ⑦ of FIG. 3 is the voltage vs. frequency characteristic when the oscillation frequency is small in the manufacturing condition. In this case, the above condition, $$f_1/2<f_2<3/2\times f_1$$

is not satisfied.

In the conventional oscillating circuit, in order to solve the problem, trimming by a resistance and so on are performed for every product to limit an oscillation frequency.

However, there is a problem in that the trimming process is necessary in the manufacturing process in the resistance trimming method, so that the manufacturing time period is elongated and the manufacturing cost increases.

SUMMARY OF THE INVENTION

The present invention is accomplished to solve the above problems. Therefore, an object of the present invention is to provide an oscillating circuit which can solve the above problems without adding a manufacturing process.

In order to achieve an aspect of the present invention, an oscillating circuit includes an oscillator for generating an oscillation signal with a frequency, for increasing the frequency of the oscillation signal in response to a frequency increase signal and for decreasing the frequency of the oscillation signal in response to a frequency decrease signal, and a detecting unit for receiving the oscillation signal and a reference signal, for outputting the frequency increase signal to the oscillator when a ratio of the frequency of the oscillation signal to a frequency of the reference signal is smaller than a first predetermined value, and for outputting the frequency decrease signal to the oscillator when a ratio of the frequency of the oscillation signal to the frequency of the reference signal is larger than a second predetermined value.

The detecting unit may include a first detector for comparing the frequency of the oscillation signal and the frequency of the reference signal to output the frequency increase signal to the oscillator when the ratio of the frequency of the oscillation signal to the frequency of the reference signal is smaller than the first predetermined value, and a second detector for comparing the frequency of the oscillation signal and the frequency of the reference signal to output the frequency decrease signal to the oscillator when the ratio of the frequency of the oscillation signal to the frequency of the reference signal is larger than the second predetermined value.

In this case, the first detector may include a first counter for counting the oscillation signal for a first time period corresponding to a dwelling time period of a "0" level or a "1" level of the reference signal to output the frequency increase signal to the oscillator when the counted value by the first counter is smaller than a third predetermined value associated with the first predetermined value. The first detector may further include a first frequency dividing circuit for frequency-dividing the reference signal such that the frequency-divided reference signal has 1/K (K≧1) of the frequency of the reference signal. Here, the first predetermined value is equal to a value obtained by dividing the counted value by the first counter by K.

Also, the second detector may include a second counter for counting the reference signal for a second time period corresponding to a dwelling time period of a "0" level or a "1" level of the oscillation signal to output the frequency decrease signal to the oscillator when the counted value by the second counter is larger than a fourth predetermined value associated with the second predetermined value. The second detector may further include a second frequency dividing circuit for frequency-dividing the oscillation signal such that the frequency-divided oscillation signal has 1/L (L≧1) of the frequency of the oscillation signal. Here, the second predetermined value is equal to a value obtained by dividing the counted value by the second counter by L.

In order to achieve another aspect of the present invention, an oscillating circuit includes an oscillator for generating an oscillation signal with a frequency, for increasing the frequency of the oscillation signal in response to a frequency increase signal and for decreasing the frequency of the oscillation signal in response to a frequency decrease signal, a detecting unit for receiving the oscillation signal and a reference signal, for generating a first increase signal when a ratio of the frequency of the oscillation signal to a frequency of the reference signal is smaller than a first predetermined value, and for generating a first decrease signal when a ratio of the frequency of the oscillation signal to the frequency of the reference signal is larger than a second predetermined value, and an adding unit for adding the first increase signal to a second increase signal to supply the adding result to the oscillator as the frequency increase signal, and for adding the first decrease signal to a second decrease signal to supply the adding result to the oscillator as the frequency decrease signal.

In this case, the oscillating circuit may further includes a frequency comparing circuit for comparing a frequency indicated by an input data and the frequency of the oscillation signal, for outputting the second increase signal to the adding unit when the indicated frequency is larger than the frequency of the oscillation signal, and for outputting the second decrease signal to the adding unit when the indicated frequency is smaller than the frequency of the oscillation signal.

In order to achieve still another aspect of the present invention, a method of controlling an oscillation frequency of an oscillating circuit, comprising the steps of:

generating a first increase signal as a frequency increase signal when a ratio of a frequency of an oscillation signal, which is generated from an oscillator, to a frequency of a reference signal is smaller than a first predetermined value;

generating a first decrease signal as a frequency decrease signal when a ratio of the frequency of the oscillation signal to the frequency of the reference signal is larger than a second predetermined value;

increasing the frequency of the oscillation signal in response to a frequency increase signal; and decreasing the frequency of the oscillation signal in response to a frequency decrease signal.

DESCRIPTION OF THE PREFERRED EMBODIMENTS

Hereinafter, the oscillating circuit of the present invention will be described below in detail with reference to the attached drawings.

Figure 4:
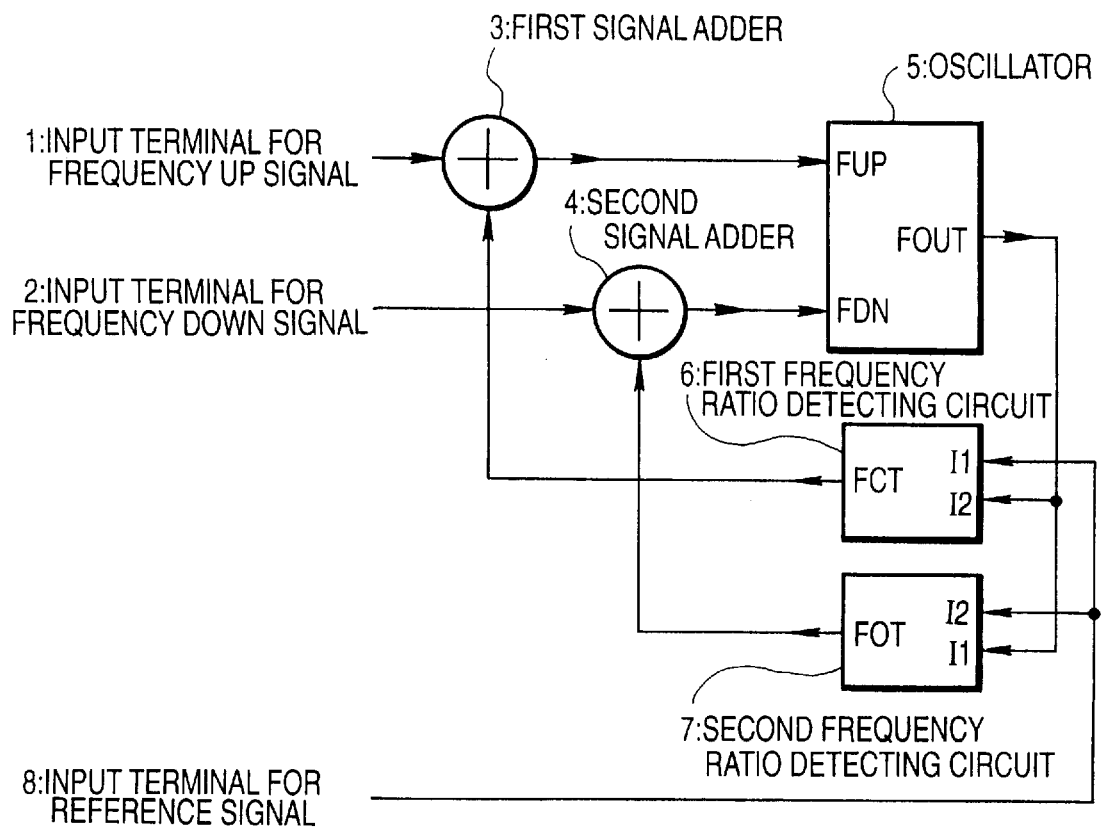
FIG. 4 is a block diagram illustrating the structure of an oscillating circuit according to a first embodiment of the present invention.

FIG. 4 is a block diagram illustrating the structure of an oscillating circuit according to the embodiment of the present invention. Referring to FIG. 4, the oscillating circuit in the embodiment is composed of first and second signal adders 3 and 4, an oscillator 5, and first and second frequency ratio detecting circuits 6 and 7.

The frequency up signal input terminal 1 is connected to one of the input terminals of the first signal adder 3. The output terminal of the first signal adder 3 is connected to the frequency up terminal FUP of the oscillator 5. The frequency down signal input terminal 2 is connected to one of the input terminals of the second signal adder 4. The output terminal of the second signal adder 4 is connected to the frequency down terminal FDN of the oscillator 5. A reference signal input terminal 8 is connected to the first input terminal I1 of the first frequency ratio detecting circuit 6 and the second input terminal I2 of the second frequency ratio detecting circuit 7. The output terminal FOUT of the oscillator 5 is connected to the second input terminal I2 of the first frequency detecting circuit 6 and the first input terminal I1 of the second frequency detecting circuit 7. The output terminal FCT of the first frequency ratio detecting circuit 6 is connected to the other input terminal of the first signal adder 3. The output terminal FOT of the second frequency ratio detecting circuit 7 is connected to the other input terminal of the second signal adder 4.

The oscillation frequency of the oscillator 5 increases when an increase signal is inputted to the frequency up terminal FUP and decreases when a decrease signal is inputted to the frequency down terminal FDN. The first frequency ratio detecting circuit 6 outputs a frequency up signal to the first signal adder 3 when a ratio of the frequency of a reference signal supplied to the input terminal I1 to the frequency of the oscillation signal supplied from the oscillator 5 to the input terminal I2 is larger than a first predetermined value. The second frequency ratio detecting circuit 7 outputs a frequency down signal to the second signal adder 4 when a ratio of the frequency of the oscillation signal supplied from the oscillator 5 to the input terminal I1 to the frequency of a reference signal supplied to the input terminal I2 is larger than a second predetermined value. In this case, the first predetermined value may be equal to the second predetermined value.

The first signal adder 3 adds the frequency up signal from the first frequency ratio detecting circuit 6 and the frequency up signal from the input terminal 1. In other words, the first signal adder 3 calculates a logical OR of the frequency up signal from the first frequency ratio detecting circuit 6 and the frequency up signal from the input terminal 1. The first signal adder 3 outputs the adding result to the FUP terminal of the oscillator 5 as the increase signal. On the other hand, the second signal adder 4 adds the frequency down signal from the second frequency ratio detecting circuit 7 and the frequency down signal from the input terminal 2. In other words, the second signal adder 4 calculates a logical OR of the frequency down signal from the second frequency ratio detecting circuit 7 and the frequency down signal from the input terminal 2. The second signal adder 4 outputs the adding result to the FDN terminal of the oscillator 5 as the decrease signal.

Figure 5:
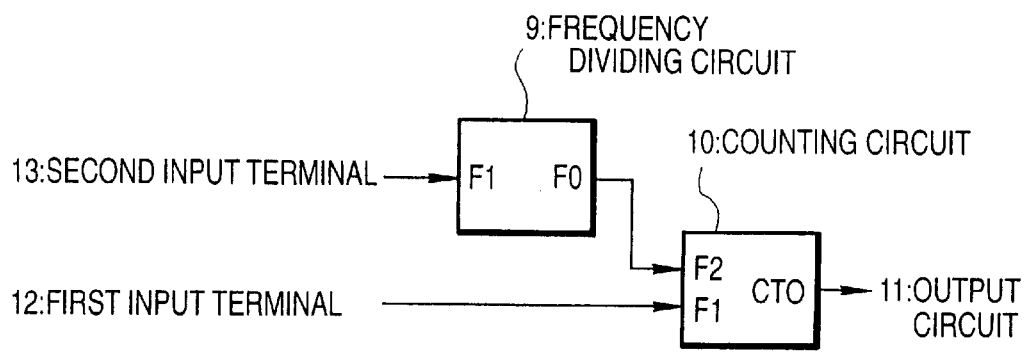
FIG. 5 is a block diagram illustrating the structure of an example of a frequency ratio detecting circuit used in FIG. 4.

FIG. 5 is a block diagram illustrating an example of the structure of the frequency ratio detecting circuit 6 or 7 which is shown in FIG. 4. As shown in FIG. 5, the frequency ratio detecting circuit 6 or 7 is composed of a frequency dividing circuit 9 and a counter 10.

A first input terminal 12 is connected to the first input terminal F1 of the counter 10. A second input terminal 13 is connected to the input terminal F1 of the frequency dividing circuit 9. The output terminal FO of the frequency dividing circuit 9 is connected to the second input terminal F2 of the counter 10. The output terminal CTO of the counter 10 is connected to an output terminal 11.

The frequency dividing circuit 9 divides the frequency of an input signal supplied from a second input terminal 13 to the input terminal F1 to 1/N. The counter 10 counts a signal which is inputted to the first input terminal F1 for a time period during which the frequency divided signal supplied to the second input terminal F2 thereof is "1" or "0" in the logic value. Then, the counter outputs a signal from the output terminal (CTO) 11 when the counted value is larger than a predetermined value.

It should be noted that if the signal supplied to the second input terminal 13 has a sufficiently large period of time, the frequency dividing circuit 9 may be omitted.

Next, the operation of the oscillating circuit according to the first embodiment of the present invention will be described with reference to FIG. 4.

It is supposed that the frequency ratio set in the first and second frequency ratio detecting circuits 6 and 7 is K (K is a positive number). In this case, when the frequency of an oscillation signal supplied from the output terminal FOUT of the oscillator 5 has K times of the frequency of the reference signal supplied from the input terminal 8, the frequency down signal is outputted to the second signal adder 4 from the output terminal FOT of the second frequency ratio detecting circuit 7. The adder 4 receives the frequency down signal from the second frequency ratio detecting circuit 7 and adds it to the frequency down signal from the input terminal 2. That is, the second signal adder 4 calculates a logic OR of the frequency down signal from the second frequency ratio detecting circuit 7 and the frequency down signal from the input terminal 2. Then, the second signal adder 4 outputs the adding result to the frequency DOWN terminal of the oscillator 5 as the decrease signal. In this manner, the frequency of the oscillation signal from the oscillator 5 decreases by using the oscillating circuit of the present invention.

On the other hand, it is assumed that the frequency of the oscillation signal from the output terminal FOUT of the oscillator 5 becomes 1/K of the frequency of the reference signal supplied from the input terminal 8. In this case, the frequency up signal is outputted from the output terminal FCT of the first frequency ratio detecting circuit 6 to the first signal adder 3. The first signal adder 3 receives the frequency up signal from the first frequency ratio detecting circuit 6 and adds it to the frequency up signal from the input terminal 1. That is, the first signal adder 3 calculates a logic OR of the frequency up signal from the first frequency ratio detecting circuit 6 and the frequency up signal from the input terminal 1. Then, the first signal adder 3 outputs the adding result to the frequency UP terminal of the oscillator 5 as the increase signal. In this manner, the frequency of the oscillation signal from the oscillator 5 increases by using the oscillating circuit of the present invention.

As above-mentioned, the frequency of the oscillation signal from the oscillator 5 can be limited.

The operation of the frequency ratio detecting circuit 6 or 7 will be described. It is supposed that the frequency of a signal supplied to the first input terminal 12 is FIN1, the frequency of a signal supplied to the second input terminal 13 of FIG. 5 is FIN2, and the frequency dividing ratio of the dividing circuit 9 is 1/N (N is a positive number). The counter 10 counts a signal supplied to the first input terminal 12 for a time period during which a logic value of the signal supplied to the second input terminal 13 is "1".

$$[\{N \times (1/FIN2)\}/2]/(1/FIN1) = (FIN1/FIN2) \times (N/2)$$

If it is supposed that the setting value of the counter 10 is P, i.e., $$(FIN1/FIN2) \times (N/2) > P$$

the counter outputs the frequency up or down signal when the frequency ratio of FIN1 and FIN2 satisfies the following relation, $$(FIN1/FIN2) > P \times 2/N$$

Next, the oscillating circuit according to the first embodiment of the present invention will be described with reference to the drawings, taking an example.

It is supposed that the frequency ratio to be detected by the first and second frequency ratio detecting circuits 6 and 7 is 1.25 in this embodiment. When the frequency of the oscillation signal supplied from the output terminal FOUT of the oscillator 5 is equal to or more than 1.25 times of the frequency of the reference signal supplied from the input terminal 8, the frequency down signal is outputted from the output terminal FOT of the second frequency ratio detecting circuit 7 to the second signal adder 4. As a result, the oscillator 5 decreases the frequency of the oscillation signal in response to the decrease signal from the second signal adder 4, by using the oscillating circuit of the present invention, On the other hand, when the frequency of the signal supplied from the output terminal FOUT of the oscillator 5 is equal to or less than 1/1.25 times of the frequency of the reference signal supplied from the input terminal 8, the frequency up signal is outputted from the output terminal FCT of the first frequency ratio detecting circuit 6 to the first signal adder 3. As a result, the oscillator 5 increases the frequency of the oscillation signal in response to the increase signal from the first signal adder 3.

In this way, the ratio of the oscillation signal from the oscillator 5 to the reference signal from the input terminal 8 in frequency can be limited to a frequency range from 1/1.25 times of the frequency of the reference signal to 1.25 times of the frequency of the reference signal.

Figure 6A:
FIGS. 6A to 6C are time charts illustrating the operation of the frequency ratio detecting circuit used in the first embodiment of the present invention.
Figure 6B:
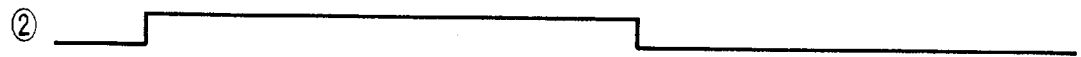
Figure 6C:

FIGS. 6A to 6C show the waveforms in case of the operation of the frequency ratio detecting circuit 6 or 7 shown in FIG. 5. The frequency of the signal supplied from the second input terminal 13 is set to be f2 and the waveform of the signal is shown in a waveform ① of FIG. 6A. The frequency dividing circuit 9 is a ⅛ frequency dividing circuit and the output waveform is shown in a waveform ② of FIG. 6B. The frequency of the first input terminal 12 is set to be f1 and the waveform of the signal is shown in waveform ③ of FIG. 6C.

When the logic value is "1", the counter 10 outputs the frequency up or down signal when the counted value is equal to or more than the predetermined value. When the predetermined value is 5, the following relation is satisfied, $$[\{8\times(1/f2)\}/2]/(1/f1) > 5$$

As a result, the relation of (f1/f2 < 5/4 = 1.25) can be realized.

Figure 1:
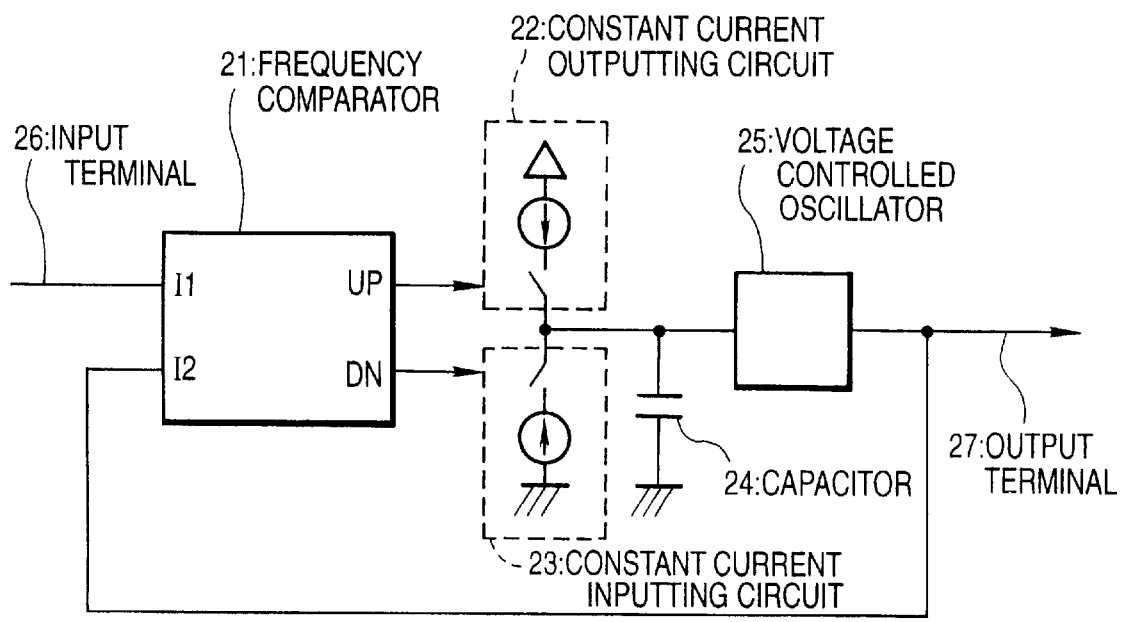
FIG. 1 is a block diagram illustrating the structure of a conventional example of an oscillating circuit.
Figure 2A:
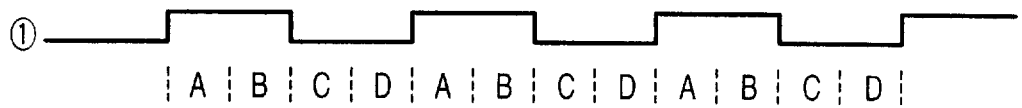
FIGS. 2A to 2E are time charts illustrating the operation of the conventional example of the oscillating circuit.
Figure 2B:
Figure 2C:
Figure 2D:
Figure 2E:
Figure 3:
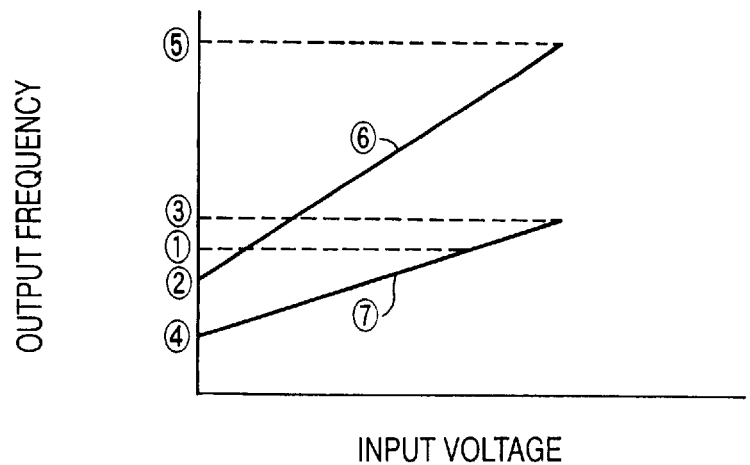
FIG. 3 is a diagram illustrating the voltage—frequency characteristic of the conventional example of the oscillating circuit.
Figure 7:
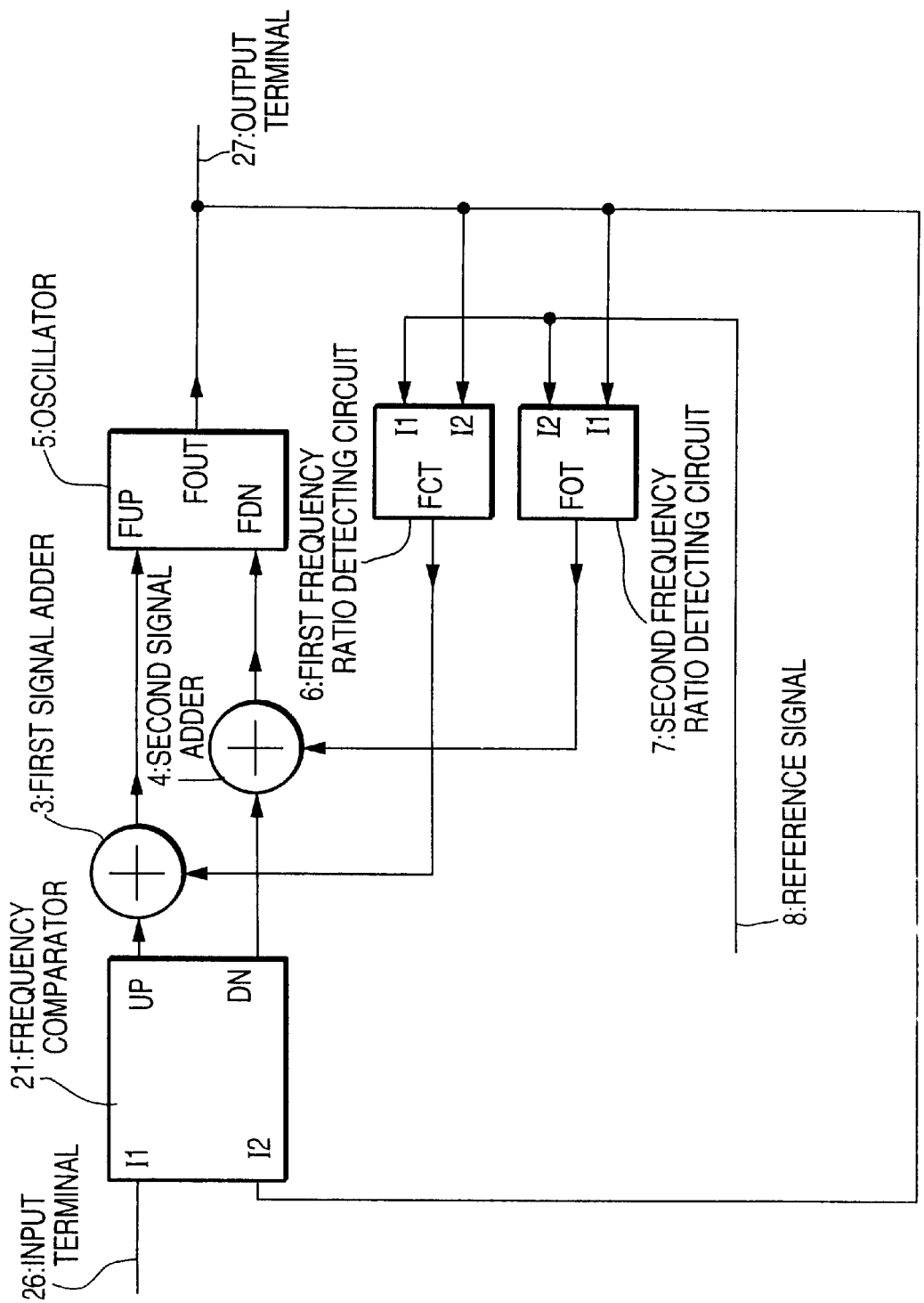
FIG. 7 is a block diagram illustrating the structure of an oscillating circuit according to the second embodiment of the present invention.

The oscillating circuit according to the second embodiment of the present invention can be realized by replacing the circuit section which is composed of the constant current outputting circuit 22, the constant current inputting circuit 23, the capacitor 24 and the voltage controlled oscillator 25 in the conventional example shown in FIG. 1, with the oscillating circuit shown in FIG. 4, as shown in FIG. 7. In this case, a reference clock signal having the predetermined frequency is supplied to the input terminal I1 of the first frequency ratio detecting circuit 6 and the input terminal I2 of the second frequency ratio detecting circuit 7. Thus, the frequency ratio can be arbitrarily set in the first and second frequency ratio detecting circuits 6 and 7. Such a circuit can be entirely realized with a small-scaled digital circuit. Therefore, the oscillation circuit of the present invention does not require an increase in manufacturing time or cost.

As described above, according to the oscillating circuit of the present invention, the frequency of the oscillator built in the oscillating circuit can be limited with the small-scaled digital circuit. Therefore, the increase in manufacturing time and cost because of the trimming step using a resistance can be avoided and the oscillating circuit can be easily realized in a semiconductor integrated circuit.

What is claimed is:

1. An oscillating circuit comprising:
   an oscillator for generating an oscillation signal with a frequency, for increasing said frequency of said oscillation signal in response to a frequency increase signal and for decreasing said frequency of said oscillation signal in response to a frequency decrease signal; and
   a detecting unit for receiving said oscillation signal and a reference signal, for outputting said frequency increase signal to said oscillator when a ratio of said frequency of said oscillation signal to a frequency of said reference signal is smaller than a first predetermined value, and for outputting said frequency decrease signal to said oscillator when a ratio of said frequency of said oscillation signal to said frequency of said reference signal is larger than a second predetermined value.

2. An oscillating circuit according to claim 1, wherein said detecting unit includes:
   a first detector for comparing said frequency of said oscillation signal and said frequency of said reference signal to output said frequency increase signal to said oscillator when said ratio of said frequency of said oscillation signal to said frequency of said reference signal is smaller than said first predetermined value; and
   a second detector for comparing said frequency of said oscillation signal and said frequency of said reference signal to output said frequency decrease signal to said oscillator when said ratio of said frequency of said oscillation signal to said frequency of said reference signal is larger than said second predetermined value.

3. An oscillating circuit according to claim 2, wherein said first detector includes:
   a first counter for counting said oscillation signal for a first time period corresponding to a dwelling time period of a "0" level or a "1" level of said reference signal to output said frequency increase signal to said oscillator when the counted value by said first counter is smaller than a third predetermined value associated with said first predetermined value.

4. An oscillating circuit according to claim 3, wherein said first detector further includes a first frequency dividing circuit for frequency-dividing said reference signal such that said frequency-divided reference signal has 1/K (K≧1) of said frequency of said reference signal, and
   wherein said first predetermined value is equal to a value obtained by dividing said counted value by said first counter by K.

5. An oscillating circuit according to claim 2, wherein said second detector includes:
   a second counter for counting said reference signal for a second time period corresponding to a dwelling time period of a "0" level or a "1" level of said oscillation signal to output said frequency decrease signal to said oscillator when the counted value by said second counter is larger than a fourth predetermined value associated with said second predetermined value.

6. An oscillating circuit according to claim 5, wherein said second detector further includes a second frequency dividing circuit for frequency-dividing said oscillation signal such that said frequency-divided oscillation signal has 1/L (L≧1) of said frequency of said oscillation signal, and
   wherein said second predetermined value is equal to a value obtained by dividing said counted value by said second counter by L.

7. An oscillating circuit comprising:
   an oscillator for generating an oscillation signal with a frequency, for increasing said frequency of said oscillation signal in response to a frequency increase signal and for decreasing said frequency of said oscillation signal in response to a frequency decrease signal;
   a detecting unit for receiving said oscillation signal and a reference signal, for generating a first increase signal when a ratio of said frequency of said oscillation signal to a frequency of said reference signal is smaller than a first predetermined value, and for generating a first decrease signal when a ratio of said frequency of said oscillation signal to said frequency of said reference signal is larger than a second predetermined value; and
   an adding unit for adding said first increase signal to a second increase signal to supply the adding result to said oscillator as said frequency increase signal, and for adding said first decrease signal to a second decrease signal to supply the adding result to said oscillator as said frequency decrease signal.

8. An oscillating circuit according to claim 7, wherein said detecting unit includes:
   a first detector for comparing said frequency of said oscillation signal and said frequency of said reference signal to output said first increase signal to said adding unit when said ratio of said frequency of said oscillation signal to said frequency of said reference signal is smaller than said first predetermined value; and
   a second detector for comparing said frequency of said oscillation signal and said frequency of said reference signal to output said first decrease signal to said adding unit when said ratio of said frequency of said oscillation signal to said frequency of said reference signal is larger than said second predetermined value.

9. An oscillating circuit according to claim 8, wherein said first detector includes:

a first counter for counting said oscillation signal for a first time period corresponding to a dwelling time period of a "0" level or a "1" level of said reference signal to output said first increase signal to said adding unit when the counted value by said first counter is smaller than a third predetermined value associated with said first predetermined value.

10. An oscillating circuit according to claim 9, wherein said first detector further includes a first frequency dividing circuit for frequency-dividing said reference signal such that said frequency-divided reference signal has 1/K (K≧1) of said frequency of said reference signal, and wherein said first predetermined value is equal to a value obtained by dividing said counted value by said first counter by K.

11. An oscillating circuit according to claim 8, wherein said second detector includes:

a second counter for counting said reference signal for a second time period corresponding to a dwelling time period of a "0" level or a "1" level of said oscillation signal to output said first decrease signal to said adding unit when the counted value by said second counter is larger than a fourth predetermined value associated with said second predetermined value.

12. An oscillating circuit according to claim 11, wherein said second detector further includes:

a second frequency dividing circuit for frequency-dividing said oscillation signal such that said frequency-divided oscillation signal has 1/L (L≧1) of said frequency of said oscillation signal, and wherein said second predetermined value is equal to a value obtained by dividing said counted value by said second counter by L.

13. An oscillating circuit according to claim 7, further comprising a frequency comparing circuit for comparing a frequency indicated by an input data and said frequency of said oscillation signal, for outputting said second increase signal to said adding unit when said indicated frequency is larger than said frequency of said oscillation signal, and for outputting said second decrease signal to said adding unit when said indicated frequency is smaller than said frequency of said oscillation signal.

14. A method of controlling an oscillation frequency of an oscillating circuit, comprising the steps of:

generating a first increase signal as a frequency increase signal when a ratio of a frequency of an oscillation signal, which is generated from an oscillator, to a frequency of a reference signal is smaller than a first predetermined value;

generating a first decrease signal as a frequency decrease signal when a ratio of said frequency of said oscillation signal to said frequency of said reference signal is larger than a second predetermined value;

increasing said frequency of said oscillation signal in response to a frequency increase signal; and decreasing said frequency of said oscillation signal in response to a frequency decrease signal.

15. A method according to claim 14, wherein said step of generating a first increase signal includes:

counting said oscillation signal as a first count for a first time period corresponding to a dwelling time period of a "0" level or a "1" level of said reference signal to output said first increase signal when said first count is smaller than a third predetermined value associated with said first predetermined value, and wherein said step of generating a first decrease signal includes:

counting said reference signal as a second count for a second time period corresponding to a dwelling time period of a "0" level or a "1" level of said oscillation signal to output said first decrease signal when said second count is larger than a fourth predetermined value associated with said second predetermined value.

16. A method according to claim 15, wherein said step of generating a first increase signal further includes:

frequency-dividing said reference signal such that said frequency-divided reference signal has 1/K (K≧1) of said frequency of said reference signal, and wherein said first predetermined value is equal to a value obtained by dividing said counted value by said first counter by K, and wherein said step of generating a first decrease signal further includes:

frequency-dividing said oscillation signal such that said frequency-divided oscillation signal has 1/L (L≧1) of said frequency of said oscillation signal, and wherein said second predetermined value is equal to a value obtained by dividing said counted value by said second counter by L.

17. A method according to claim 14, further comprising the steps of:

adding said first increase signal to a second increase signal, the adding result being said frequency increase signal; and adding said first decrease signal to a second decrease signal, the adding result being said frequency decrease signal.

18. A method according to claim 17, further comprising the step of:

comparing a frequency indicated by an input data and said frequency of said oscillation signal;

generating said second increase signal when said indicated frequency is larger than said frequency of said oscillation signal; and generating said second decrease signal when said indicated frequency is smaller than said frequency of said oscillation signal.

* * * * *